United States Patent
Zundel et al.

(10) Patent No.: US 7,211,860 B2
(45) Date of Patent: May 1, 2007

(54) SEMICONDUCTOR COMPONENT INCLUDING PLURAL TRENCH TRANSISTORS WITH INTERMEDIATE MESA REGIONS

(75) Inventors: Markus Zundel, Taufkirchen (DE); Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/857,353

(22) Filed: May 28, 2004

(65) Prior Publication Data
US 2005/0017293 A1  Jan. 27, 2005

(30) Foreign Application Priority Data
May 30, 2003  (DE) ................. 103 24 754

(51) Int. Cl.
*H01L 29/76* (2006.01)
(52) U.S. Cl. ............... 257/330; 257/331; 257/332; 257/333; 257/334
(58) Field of Classification Search ............... 257/330, 257/331, 332, 334, 329
See application file for complete search history.

(56) References Cited

U.S. PATENT DOCUMENTS 6,429,481 B1  8/2002  Mo et al.
6,534,823 B2  3/2003  Hueting et al.
6,551,881 B1 *  4/2003  Letavic .................... 438/267

FOREIGN PATENT DOCUMENTS

| DE | 19935442 C1 | 12/2000 |
|---|---|---|
| DE | 10153315 A1 | 5/2003 |
| EP | 1168455 A2 | 1/2002 |
| EP | 0 895 290 B1 | 10/2002 |
| WO | WO 00/42665 A1 | 7/2000 |

* cited by examiner

*Primary Examiner*—Evan Pert
*Assistant Examiner*—Tan Tran
(74) *Attorney, Agent, or Firm*—Maginot, Moore & Beck

(57) ABSTRACT

In the case of the semiconductor component (1) according to the invention, the source regions (S), the body regions (B) and, if appropriate, the body contact regions (Bk) are in each case arranged in mesa regions (M) of adjacent trenches (30). In the edge region (R) of the cell array (Z) the insulation (GOX, FOX) of the underlying trench structures (30) by an insulating oxide layer (FOX) is comparatively thick and formed in the form of a field oxide (FOX) or thick oxide (FOX).

23 Claims, 11 Drawing Sheets

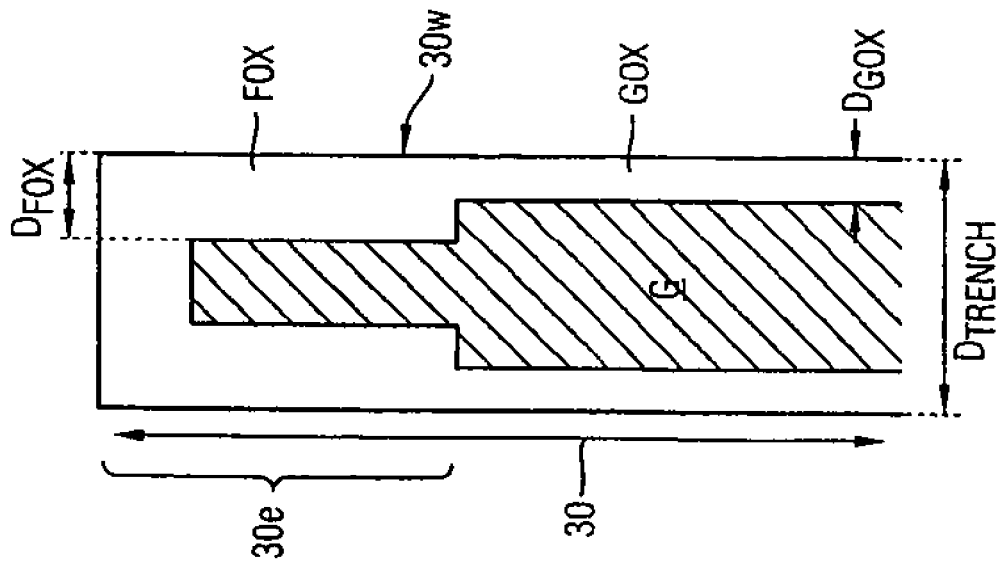
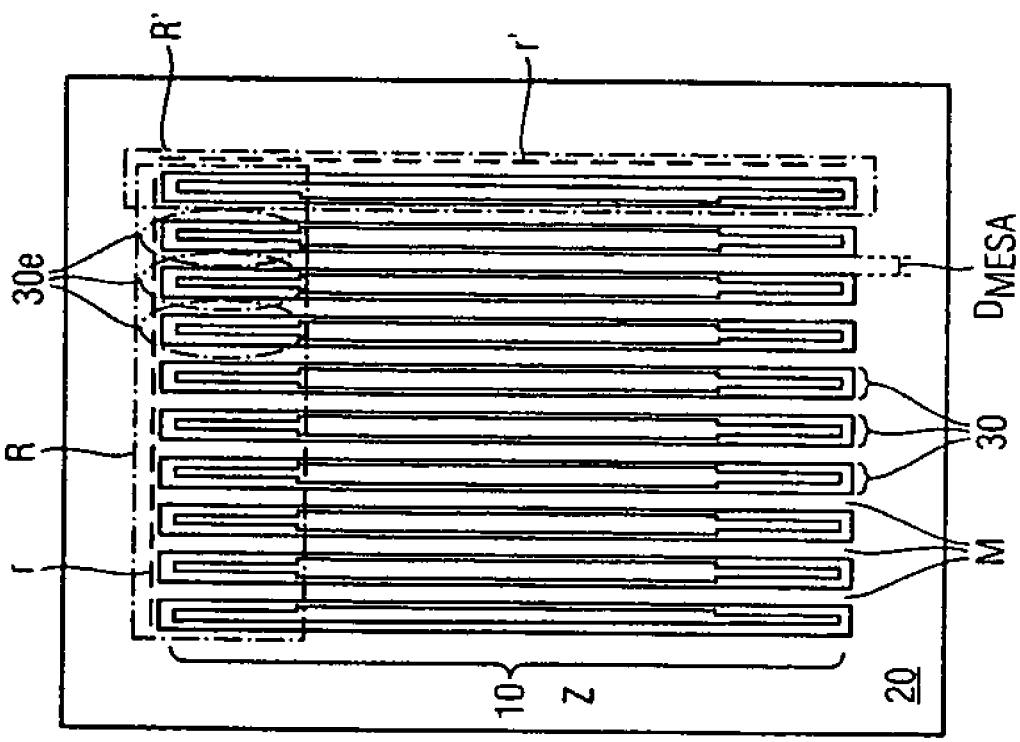

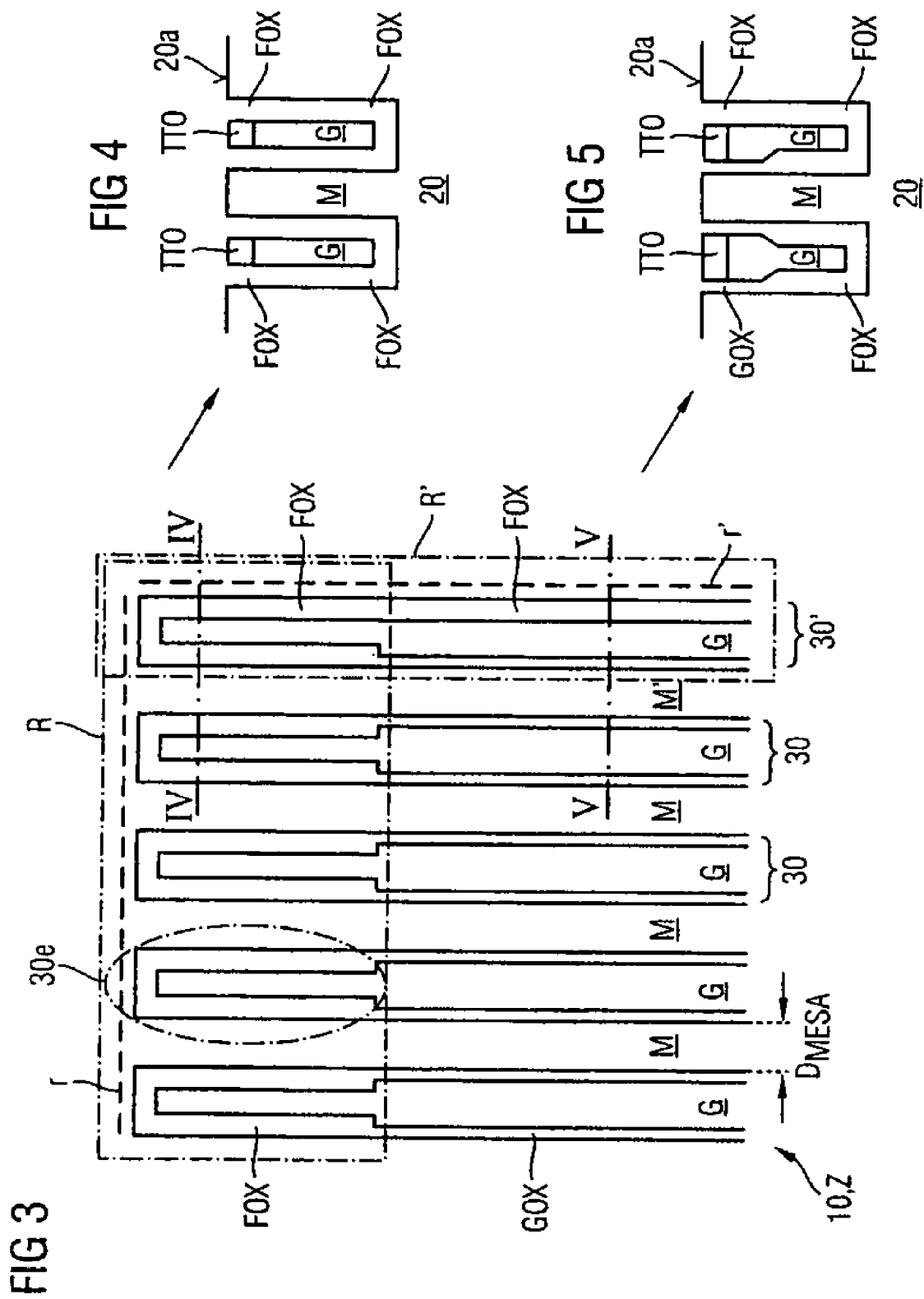

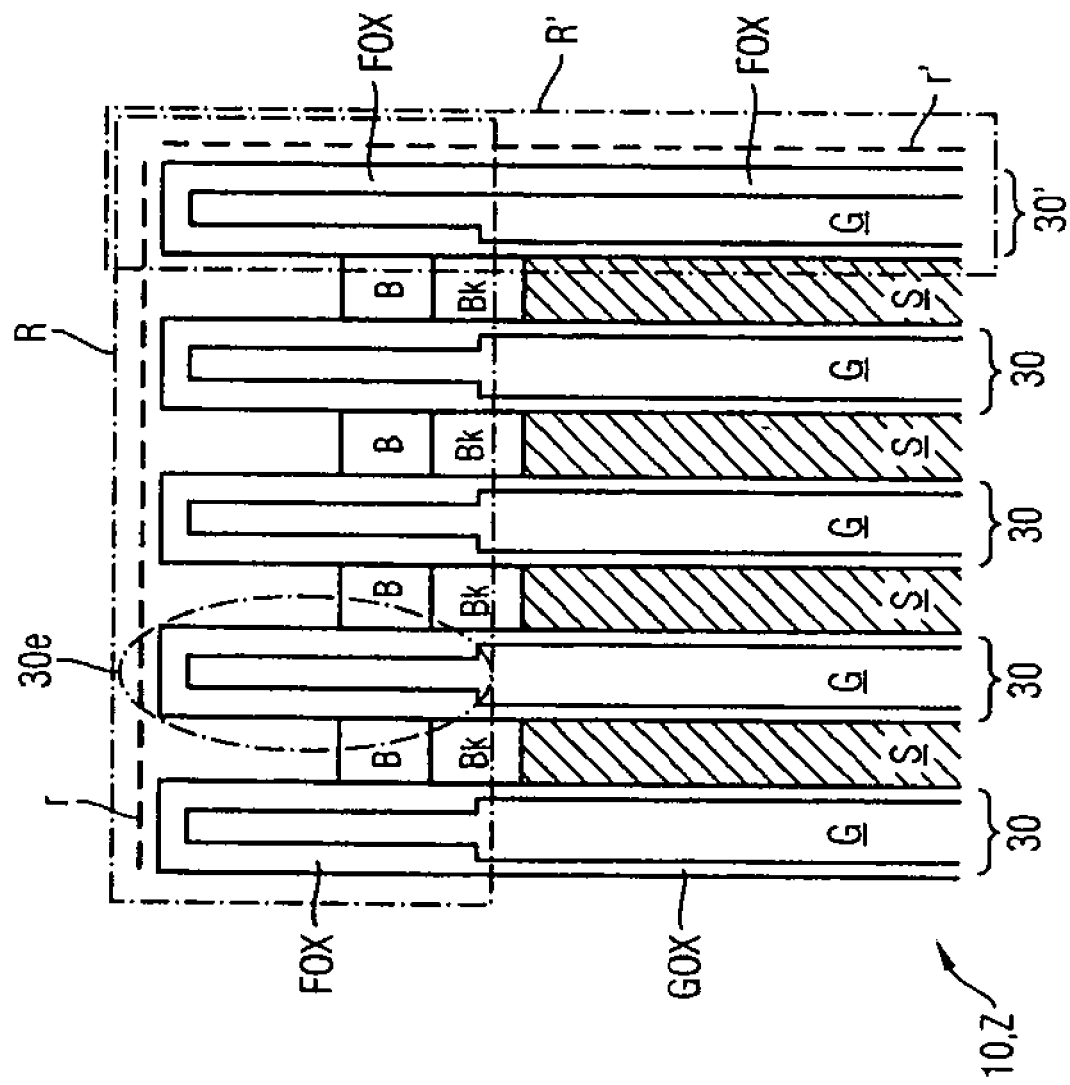

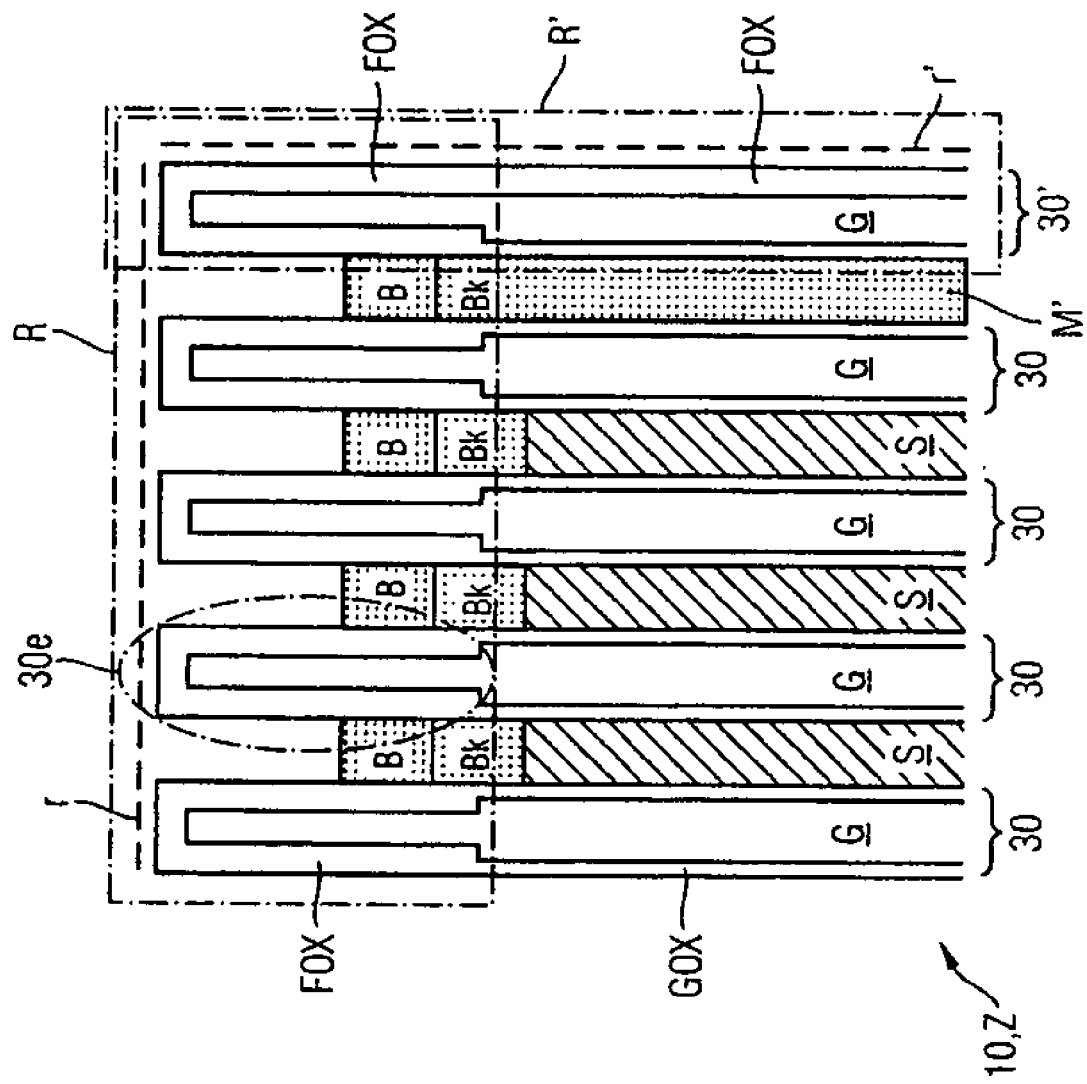

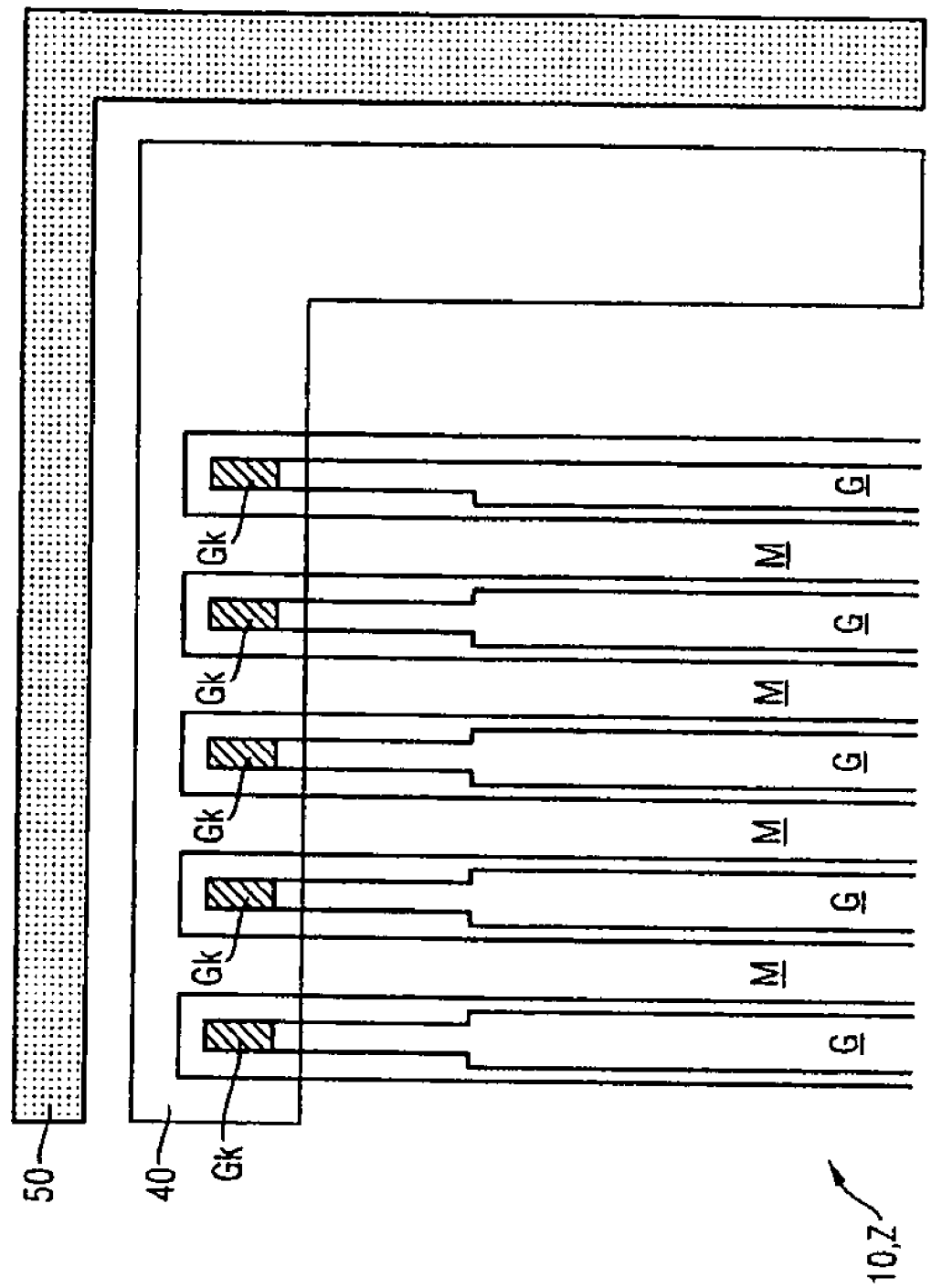

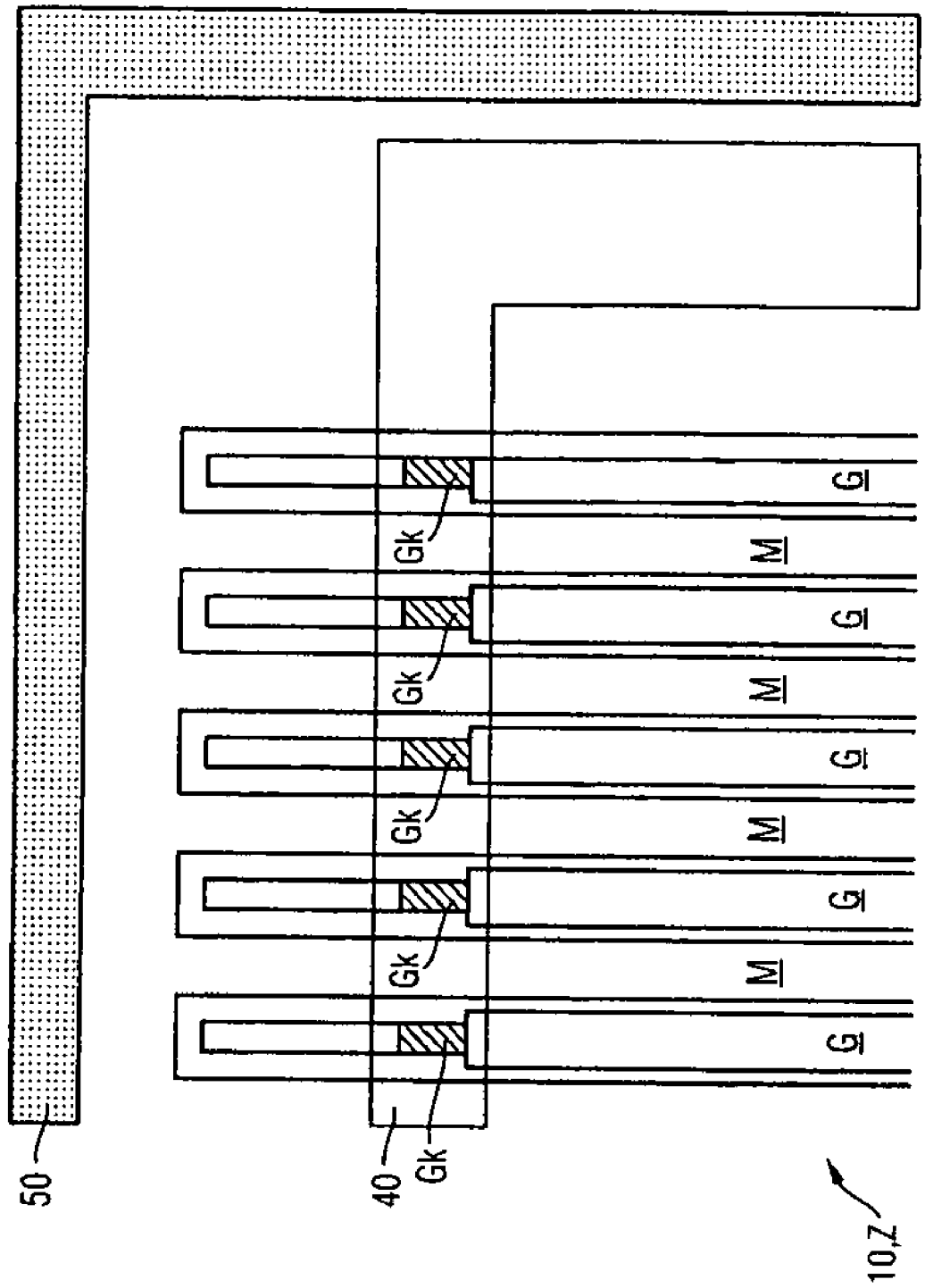

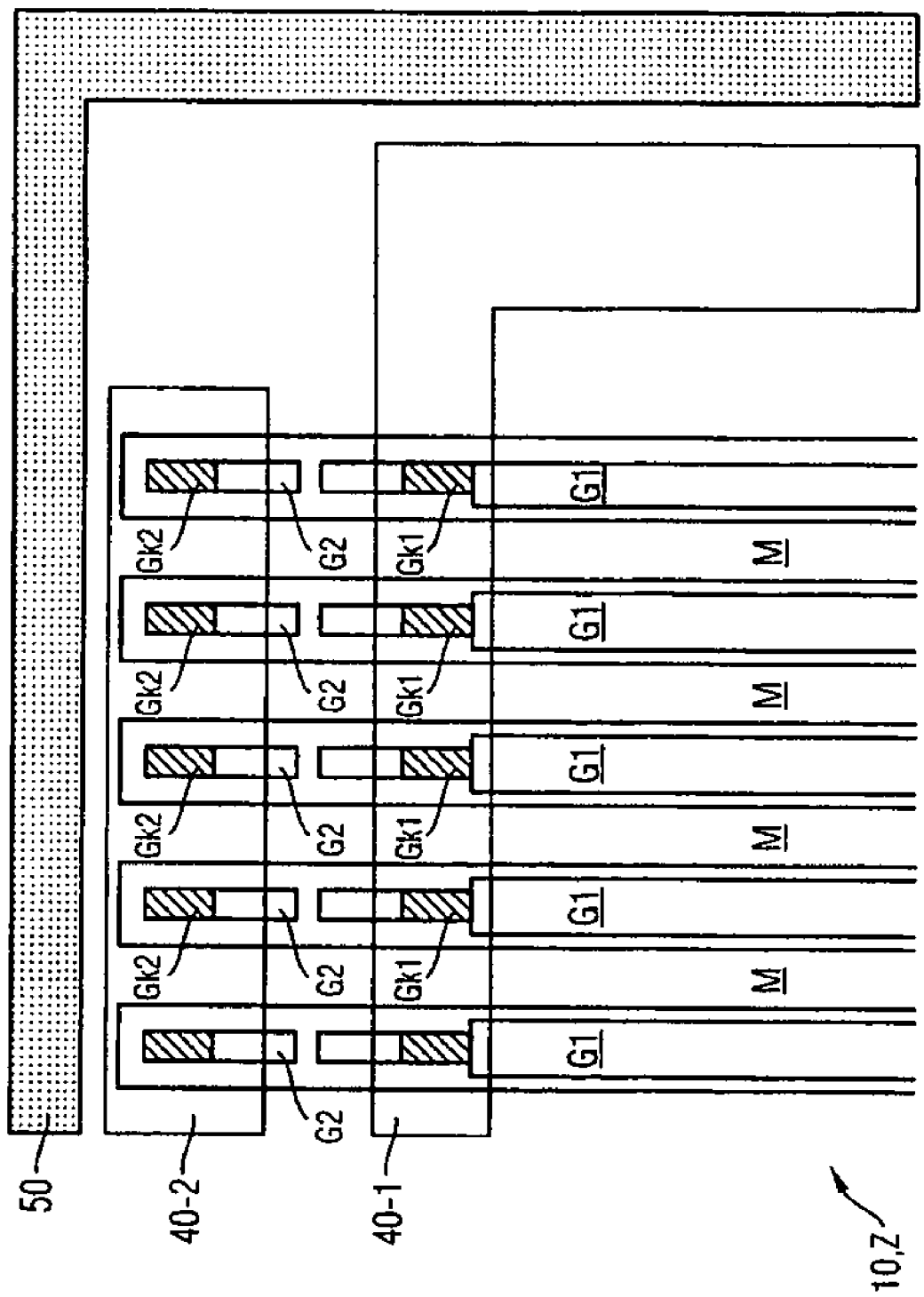

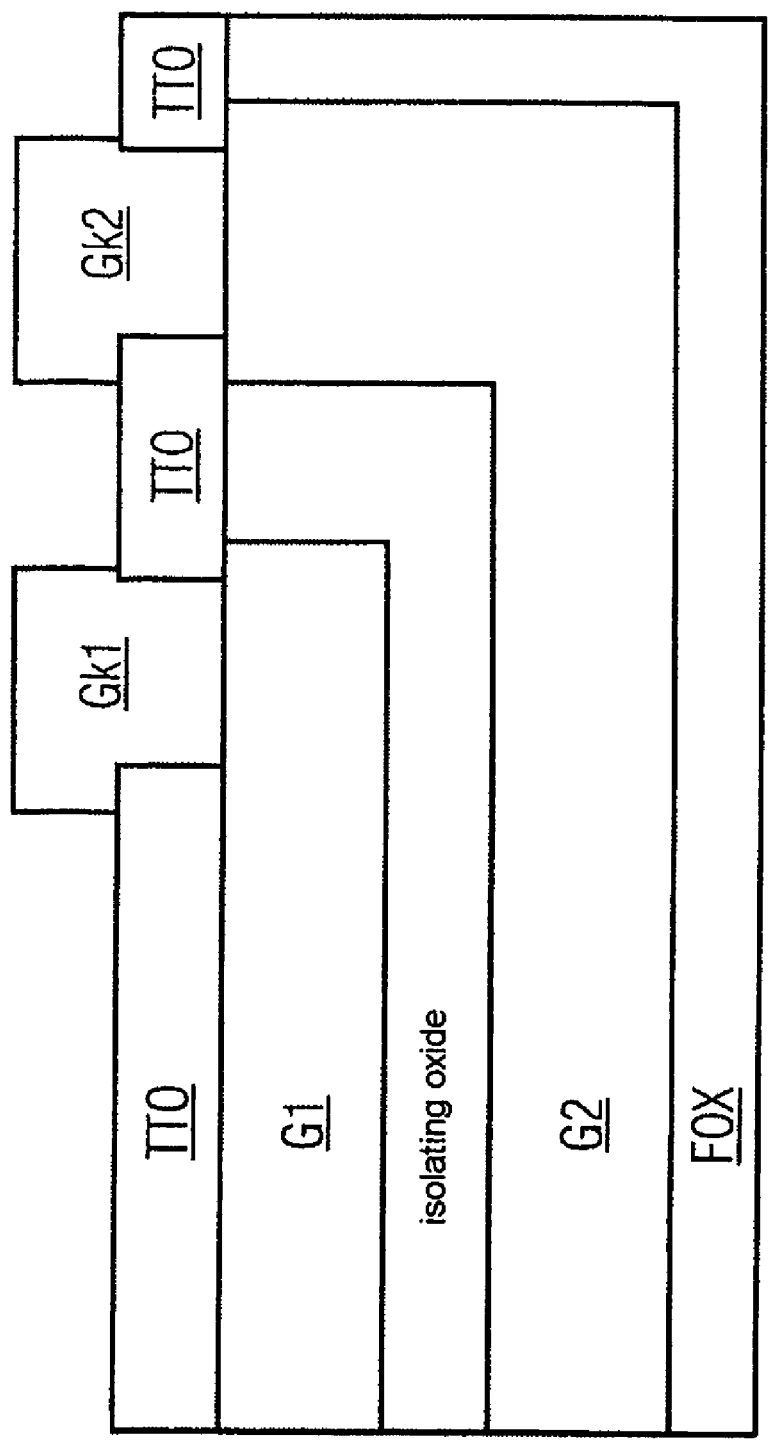

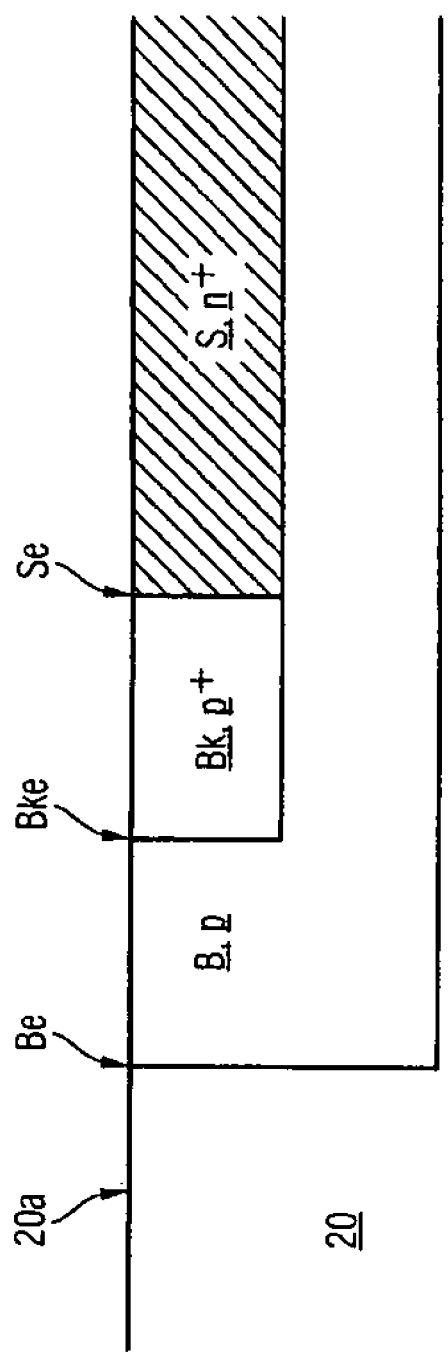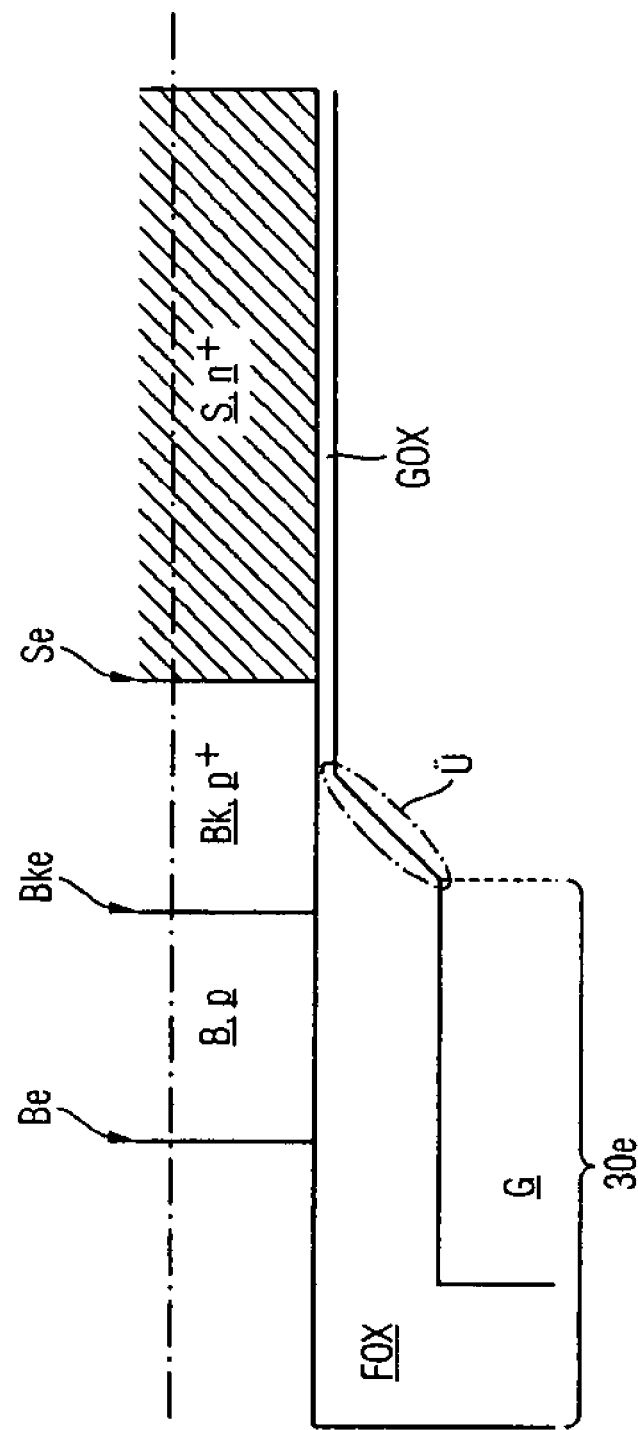
FIG 12A
FIG 12B

SEMICONDUCTOR COMPONENT INCLUDING PLURAL TRENCH TRANSISTORS WITH INTERMEDIATE MESA REGIONS

BACKGROUND

1. Technical Field

The present invention relates to a semiconductor component.

2. Description of Related Art

Reducing the area-specific on resistance $R_{on} \cdot A$ is of great importance in the further development of a large number of semiconductor components, particular consideration being given in this case to, in particular, the field of power semiconductor components and the so-called DMOS power transistors in this field. In this case one of the essential objectives besides lowering the area-specific on resistance $R_{on} \cdot A$ is simultaneously forming a good breakdown or avalanche strength of the semiconductor component respectively fabricated.

Although there are indeed measures that promise much, e.g. the so-called field plate concept, for providing corresponding architectures which can realize these component properties, these known concepts by themselves are not sufficiently, particularly in the edge region of a chip or of a cell array on a chip, in order to enable the required properties described above to be realized in a simple manner in the case of a power semiconductor component.

Therefore, the invention is based on the object of specifying a semiconductor component in which, even in the edge region of a chip or cell array, it is possible to achieve particularly favorable properties with regard to the on resistivity and the breakdown strength or avalanche strength without a high outlay.

SUMMARY

Embodiments of the invention include those set forth in the paragraphs below.

In the case of the semiconductor component according to the invention, in a semiconductor material region or a chip, provision is made of a trench structure transistor arrangement or trench transistor arrangement having a transistor cell array of a plurality of trench structure transistor devices or trench transistors arranged essentially in strip-type fashion in trench structures or trenches of the semiconductor material region. The transistor cell array is patterned in open fashion. Gate electrode regions, gate regions or gate electrodes of the respective trench structure transistor devices or trench transistors are formed essentially in the interior of the trench structure and, in this case, are electrically insulated from the wall regions of the trenches or the trench structure by an insulating oxide layer, namely a gate oxide in the broader sense. Source regions, body regions and optionally provided body contact regions of the trench structure transistor device or of the trench transistor, are in each case arranged in the so-called mesa region of the semiconductor material region, namely in the region between directly adjacent trench structures or trenches, the source regions in each case being genuinely contained in the assigned body regions and having a common surface region, in particular, with the latter.

According to the invention, in the first or upper edge region of the cell array and/or of the semiconductor material region, the insulating oxide layer is formed, in end regions of the trench structures or trenches, with a comparatively large or high layer thickness, in particular in the form of a so-called field oxide or thick oxide. This layer thickness is chosen to be comparatively high or large in comparison with the layer thickness of the insulating oxide outside the first or upper edge region or in the upper trench region, namely in comparison with a gate oxide in the narrower sense.

Consequently, a central idea of the present invention is to reinforce the insulating oxide in the sense of a thick oxide or field oxide at the ends of the trenches.

In an advantageous manner, in the first or upper edge region of the cell array in end regions of the trench structures or trenches, the source regions of the trench structure transistor devices or of the trench structures and/or the ends thereof are in each case arranged laterally strictly at the level of the gate oxide in the narrower sense.

As an alternative or in addition, according to the invention, the body regions and, if appropriate, the body contact regions are formed in the first or upper edge region of the cell array in end regions of the trench structures or trenches laterally at the level of the field oxide and in a manner spaced apart from the first or upper edge of the cell array.

Further aspects of the invention are thus the arrangement of the body regions and/or of the body contact regions of the marginal transistors and/or the ends thereof in the region of the field oxide or thick oxide, to be precise genuinely in the interior of the region defined by the field oxide, i.e. thus with a finite distance from the first or upper edge of the cell array. In this case, the open structure of the cell array is also essential.

The measures provided according to the invention consequently result in a simplified geometry of the cell array with regard to the strip structure of the trenches, avoiding crossings, angled portions and T elements in the trench geometry, and thus also the excessive field strength increases with regard to the electric field produced there that accompany these known geometry problems.

The semiconductor component according to the invention is developed by the fact that the body contact region is arranged and/or formed in each case in a manner genuinely spaced apart from the first or upper edge and/or the body contact region is arranged and/or formed with a contact and/or with an overlap with the respective body region.

As an alternative or in addition, it is provided that one or a plurality of body contact regions or parts thereof are arranged and/or formed in a manner replacing a region or part of the respective source region.

In another refinement of the semiconductor component according to the invention, it is provided that one or a plurality of body contact regions or parts thereof are arranged and/or formed marginally with regard to the respective source region, in particular toward to the first or upper edge region.

Furthermore, as an alternative or in addition, it is provided that a plurality of body contact regions are provided in a respective source region, in particular with a comparatively laterally far extended body contact region that is marginal with respect to the source region, and one or a plurality of further body contact regions, which replace parts or a region of the respective source region.

In a particularly preferred embodiment of the component according to the invention, it is provided that the body region of a respective trench structure transistor device and/or the end or ending thereof is arranged in each case from the edge of the cell array laterally strictly within the respective region defined by the field oxide.

As alternative or in addition, it is provided that in this case, if appropriate, the body contact region of the respective trench structure transistor device and/or the end or ending thereof is in each case arranged between the corresponding source region and the correspondingly provided body region, in particular in a region which is in each case defined by the transition between field oxide and gate oxide.

As an alternative to this, it is provided that the body contact region of the respective trench structure transistor device and/or the end or ending thereof is arranged in each case from the edge of the cell array laterally strictly within the respective region defined by the field oxide and/or that the body region of the respective trench structure transistor device and/or the end or ending thereof is arranged in each case between the corresponding source region and the corresponding body contact region, in particular in a region which is defined in each case by the transition between field oxide and gate oxide.

The already discussed open patterning of the cell array may advantageously be realized in that, between the cell array and the edge region of the cell array and/or of the semiconductor material region or of the chip at the vertical level of the trench structures, semiconductor material is continuously provided, in particular a silicon material and/or in particular in a manner reaching from the surface of the cell array or of the semiconductor material region or chip as far as the depth of the respective trench structures.

In another embodiment of the semiconductor component according to the invention, it is provided that the cell array is formed by a plurality of essentially identical and essentially equidistantly spaced-apart trench structures or trenches in the form of an essentially homogeneous strip arrangement.

Furthermore, it may be provided that a trench structure which is essentially completely marginal or arranged in the second or lateral edge region of the cell array completely has, at least on the edge side, an oxide or field oxide as insulating oxide layer.

As an alternative or in addition, it may be provided that a trench structure which is essentially completely marginal or arranged in the second or lateral edge region of the cell array is formed without source region at least in its edge-side mesa region.

In this case, it is provided for, in particular, that the mesa regions of further trench structures are formed without source region in contiguous fashion directly adjacent to the trench structure arranged in the second or lateral edge region of the cell array.

In addition or as an alternative, it is provided that, in the case of a trench structure which is essentially completely marginal or arranged in the second or lateral edge region of the cell array, a body contact region that completely covers the dimension of the edge-side mesa region is formed.

In this case, it is provided, in particular, that directly adjacent to the trench structure arranged in the second or lateral edge region of the cell array, the mesa regions of further trench structures are contiguously formed in each case with a body contact region that laterally completely covers the dimension of the respective mesa region.

Preferably, the trench structure transistor devices are in each case formed as field plate transistor devices.

As an alternative or in addition, it is provided that the thickness $D_{FOX}$ of the field oxide is significantly greater than the thickness $D_{GOX}$ of the gate oxide in each case in the upper region of the respective trench structure, where in particular $D_{FOX} > 1.5\ D_{GOX}$ and preferably $D_{FOX} \geq 2.5\ D_{GOX}$ holds true.

Furthermore, it is advantageous if the thickness of the field oxide is significantly greater than the thickness of the gate oxide in the narrower sense, to be precise of the gate oxide in each case in the upper region of the respective trench structure of the respective trench.

Particular consideration is given to the concept according to the invention in the application in the so-called dense trench concept. In this case, it is provided that the width $D_{MESA}$ of the mesa respectively situated between two directly adjacent trench structures, or of the corresponding mesa region, is less than the width of the trench structure $D_{TRENCH}$: $D_{MESA} < D_{TRENCH}$.

In particular, it may be provided in the context of the so-called dense trench concept that the width $D_{MESA}$ of the mesa region respectively situated between two directly adjacent trench structures or trenches is less than 2.5 times the thickness $D_{FOX}$ of the field oxide or than—in the narrower sense—2.5 times the thickness $D_{GOX}$ of the gate oxide.

With regard to the contact-connection of the gate regions or of the gates, various embodiments are afforded in the context of the concept according to the invention.

Thus, it may be provided, by way of example, that, for the contact-connection of the gate regions, in each case at least one gate contact region is formed in an aligned manner on the respective trench laterally in the region of the field oxide or thick oxide in the respective end region of the trench structure or of the trench.

In this case, it may be provided that the respective gate contact is arranged in a manner spaced apart from the first or upper edge of the cell array, such that the respective gate contact region is genuinely formed within that region of the respective trench or of the respective trench structure which is defined by the field oxide, i.e. thus with a finite distance from the actual first or upper edge of the cell array, so that the absolute and distal ends of the respective trench structures or ends remain free.

In all these embodiments, it may be provided according to the invention that a source implantation region is provided and arranged as source implantation ring genuinely outside the cell array of the semiconductor component and/or the edge and/or outside the respective trench at the upper edge or edge region.

These and further advantages and aspects of the present invention are also illustrated further on the basis of the remarks below:

Reducing the on resistivity $R_{on} \cdot A$ is of great importance in the development of new generations of DMOS power transistors. A very low area-specific on resistance $R_{on} \cdot A$ can be achieved through the concept of the "dense field plate trench". In order to obtain not only the low area-specific on resistance $R_{on} \cdot A$ but also good breakdown properties and/or a good avalanche strength, optimization both of the dense trench cell and of the chip edge is indispensable. The conventional chip edge concepts prove to be disadvantageous for the dense trench concept, primarily owing to the structures or mesa width becoming ever smaller. This suggests the design of a new chip edge concept.

In the case of a typical chip edge termination, the trench cell array usually ends e.g. with a transverse trench from which, in turn, trench fingers for the gate contact-connection lead outward. Very many trench T pieces and/or trench crossings are embodied in this region. The polysilicon of the gate regions is drawn out of said trench fingers to the silicon surface, where it is contact-connected by means of contact holes. As a variant, the polysilicon is left in a separately produced transverse trench and contact-connected by means of contact holes directly on this trench.

The invention proposes, inter alia, introducing a new concept for the chip edge in the dense trench concept with the breakdown site at the trench bottom. The new concept has become necessary both for technological reasons and for reasons of the potential distribution and configuration of the breakdown site.

The concept proposed here is based on simple trench strips. Since the full drain voltage may be present toward the chip edge in the off-state case, however, the ends of said trench strips have to be embodied completely with thick oxide on both sides.

For the same reason, the two respective laterally outermost trench strips likewise optionally have to be embodied with thick oxide at least at their trench outside wall over the full length. The trench layout is preferably a simple homogeneous strip design, because 3D simulations reveal that deviations from this type of layout always lead to excessive electrical field increases and, consequently, the breakdown voltage is significantly reduced. It is thus necessary to avoid T pieces, trench crossings and any appreciable angled portions (greater than 5°), as are shown in FIG. 12, in the trench layout. Furthermore, it is equally necessary to avoid trench widenings e.g. for large gate contact areas, since the mesa zone between the trenches is thereby constricted, as is shown in FIG. 13, which in turn leads to an undesirable reduction of the breakdown voltage (Ubr) in the chip edge.

Source region endings between dense trenches without being completely embedded in a body region are to be avoided, in principle; at the profile curvatures, large excessive field increases likewise arise and a reduced Ubr arises. A direct consequence of this is that the source implantation ring (or any $n^+$-type doping) for suppressing the parasitic p-channel transistor which can form from the sawing edge as far as the cell array must run distinctly outside the trench ends. However, the source implantation ring may optionally run along the last trench at the outer trench wall. In this case, the possible breakdown site in the corner of Si surface and trench sidewall is weakened. In order to weaken this corner at the trench ends, the trenches are to be led through outward below the gate metallization to an extent such that the potential lines can run freely perpendicularly upward and thus alleviate said corner. The source region in the last mesa zone toward the lateral chip edge is preferably to be obviated or optionally to be replaced by a whole-area body contact region in order to avoid the switching-on of the parasitic bipolar transistor at the chip edge in the event of breakdown.

Body region endings between dense trenches are suitable only when they end in whole-area fashion coming from the cell array in the outer trench region—where there is thick oxide everywhere in the trench—and also do not begin anew again. This body region ending is a potential breakdown site, but is always a few volts higher than the breakdown site at the trench bottom. The body region endings have to be connected particularly well by means of body contact regions in order to achieve a good avalanche strength, to be precise in order to avoid the switching-on of the parasitic bipolar transistor in this region, since the avalanche charges have to extracted from the entire chip edge region. It automatically follows from the conditions for source, body and body contact regions between the trenches that, coming from the cell array, in a manner directed toward the outside, first of all the source region, then the body contact region and finally the body region have to end.

One possible basic idea thus consists in the provision of a new chip edge concept which is suitable for the dense trench concept. In this case, it may be necessary essentially to comply with the following rules and combine them with one another:

a) Trench strip design without trench crossings or trench T pieces,
b) Trench strip design without mesa region constrictions,
c) Trench strip design with trench ends which are completely filled with thick oxide,
d) Trench strip design with lateral edge trench which is filled with thick oxide at least on the outside and in the trench bottom region,
e) Source region endings between the trenches possible only if embedded in the body region, and
f) Body region endings between the trenches possible only if they are formed in the region of the trench ends with thick oxide in the trenches.

Further rules can optionally be employed, if appropriate in combination:

g) Source implantation ring ($n^+$ ring) for suppressing the p-channel parasitics at a distance from the trench ends, optionally adjoining longitudinal sidewall of the last edge trench,
h) Lengthen trench ends outward beyond metal ring(s) in the chip edge,
i) Body region endings between the trenches are to be connected particularly well via body contact regions, and
j) Last mesa region toward the lateral chip edge is embodied without a source, instead optionally with whole-area body contact.

These rules preferably apply in the regime of the dense field plate trench, in other words the trenches have to be packed so densely that the breakdown site is always situated at the trench bottom.

The present chip edge concept can also be applied to p-channel transistors, IGBTs and drain-up transistors in ICs, as well as to trench transistors having a plurality of electrodes in the trench.

Furthermore, it is possible to combine this chip edge concept with the contact-connection of the (poly-) electrode(s) in the trench by means of a contact hole aligned directly with the trench. This type of contact-connection directly to the trench has the advantage that the poly-patterning on the Si surface can be omitted and a mask technique is thus obviated. The contact-connection of the electrodes in the trench may optionally also be performed by means of a poly-plug.

Compared with a trench layout with T pieces or trench crossings, this chip edge concept additionally has the technological advantage of significantly improving the homogeneity during deposition processes (e.g. polysilicon into the trench or TEOS/BPSG) and also during recess etchings into the trench.

BRIEF DESCRIPTION OF THE DRAWINGS

The invention is explained in more detail below using preferred embodiments on the basis of the accompanying drawing.

FIG. 1 shows a diagrammatic plan view of an embodiment of a semiconductor component according to the invention for rough orientation.

FIG. 2 shows a diagrammatic plan view of details of an end region of a trench of the embodiment of FIG. 1.

FIG. 3 shows another embodiment of the semiconductor component according to the invention in the form of a diagrammatic plan view.

FIG. 4, 5 show, in diagrammatic cross-sectional view, sections through the embodiment of FIG. 3, to be precise along the lines IV—IV and V—V, respectively.

FIG. 6-9 show other embodiments of the semiconductor component according to the invention in the form of diagrammatic plan views.

FIG. 10, 11 show an embodiment of the semiconductor component according to the invention with two gate electrodes or generally trench electrodes in the form of a diagrammatic plan view and in the form of a diagrammatic sectional side view, respectively.

FIG. 12A, B elucidate various geometrical aspects of the present invention in the form of a diagrammatic and lateral cross-sectional view and also a diagrammatic plan view.

Hereinafter, identical reference symbols designate structural and functionally identical or identically acting elements and components. A detailed description is not specified for every occurrence.

DETAILED DESCRIPTION

Figure 13:
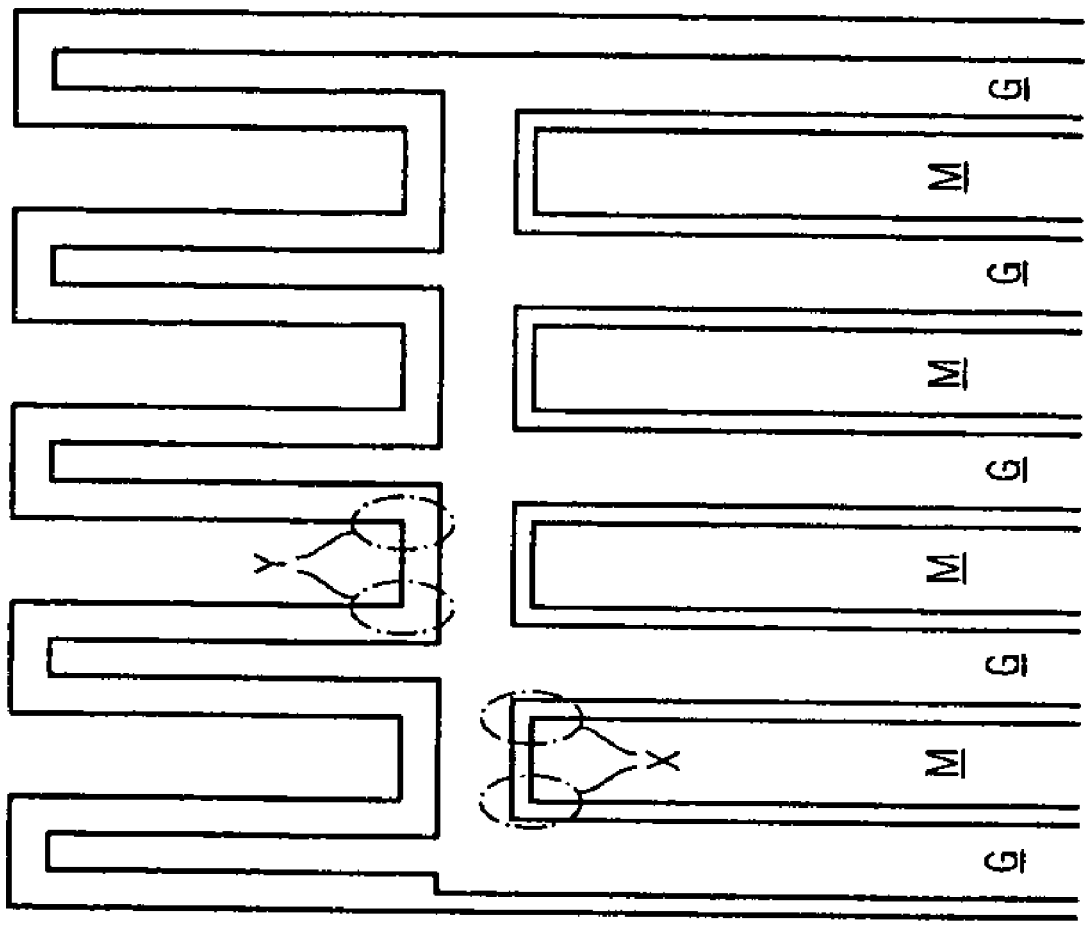
FIG. 13, 14 elucidate problems which occur in the prior art in the form of diagrammatic plan views.

FIG. 1 shows a first embodiment of the semiconductor component 1 according to the invention in the form of a diagrammatic plan view for rough orientation.

A trench structure transistor arrangement 10 in the form of a cell array Z having a plurality of trench structure transistor devices T or trench transistors T is formed in a semiconductor material region 20 or a semiconductor substrate 20, which, for the sake of simplicity, may also be referred to as a chip. The trench structures 30 or trenches 30 provided for this are formed parallel to one another and equidistantly in the semiconductor material region 20. The trenches 30 are essentially of identical type, in particular with regard to their patterning, e.g. with regard to their outer width $D_{TRENCH}$, which is chosen to be identical for all the trenches. The intermediate regions M between directly adjacent trenches 30 are also referred to as mesa M and have a width or mesa width $D_{Mesa}$ that is identical for the entire cell array Z. The illustrations which are specified in FIG. 1 and also in the subsequent figures are not true to scale with regard to the dimensions.

The cell array Z has first or upper and lower edge regions R and edges r with regard to the end regions 30e of the trenches 30. The edges r form corresponding first or upper and lower edge regions R of the cell array Z or of the semiconductor material region 20 or of the substrate 20 or of the chip.

Second or lateral edges r' with corresponding second or lateral edge regions R' of the cell array Z are also formed laterally.

FIG. 2 shows a corresponding end region 30e of a trench 30 from FIG. 1 in greater detail. This serves for more clearly illustrating the concrete details of said end region 30e. The trench 30 has a uniform outer diameter $D_{TRENCH}$. The wall region 30w, to be precise with regard to the lateral walls and the walls at the ends, is formed with an insulating oxide layer, namely a gate oxide in the broader sense. Said gate oxide in the broader sense is formed by a comparatively thin layer of a gate oxide GOX in the narrower sense or, if appropriate, by a so-called field oxide FOX or thick oxide. The inner diameter which can be filled with gate electrode material or the inner width of the trench 30 is partly constricted by said insulating oxide layer.

The gate oxide GOX in the narrower sense, i.e. the comparatively thin insulating oxide layer, lines the entire trench 30 apart from the outermost regions 30e of the trench 30. It is only in the outermost end region 30e that provision is made of the relatively thicker field oxide FOX for lining the wall regions 30w, in the manner illustrated in FIG. 2. The gate oxide GOX in the narrower sense has a layer thickness $D_{GOX}$ which is less than the layer thickness $D_{FOX}$ of the field oxide FOX: $D_{GOX} < D_{FOX}$.

After these fundamental explanations of the detail structures, further preferred embodiments of the semiconductor component according to the invention will now be illustrated.

FIG. 3, in the form of a diagrammatic and sectional plan view, gives an overview of the layer thickness conditions of the oxide layers GOX and FOX that insulate the gate G or the gate region in the trenches 30 in the edge region R and R' of a cell array Z of the trench structure transistor arrangement 10 of a semiconductor component 1 according to the invention. The illustration reveals trench structures 30 or trenches 30, which are arranged within the cell array Z, and also an edge trench structure 30', which laterally forms the termination of the cell array Z. The inner trenches 30 or trench structures 30 are all formed identically. The structures produced are formed by so-called field plate transistors with regard to the transistor function. In this case, starting from a specific depth of the trench structure 30, the insulating oxide layer is a thick oxide in the form of a field oxide FOX, as is shown in FIG. 5 and also in FIG. 4 in cross section. For the inner trench structures 30 which are remote from the edge of the lateral cell array R' of the cell array Z, a thinning to form a gate oxide GOX in the narrower sense then takes place toward the upper region of the respective trench 30, as is illustrated in cross section in FIG. 5 and in plan view in FIG. 3. Only the lateral marginal trench structure 30' has a thick oxide FOX continuously on the side toward the edge r' of the cell array Z. The thick oxide FOX or field oxide FOX serves for enabling the reverse voltage that occurs at the edge of the chip to be held, or, in other words, for insulating the gates G in the trenches 30 from the possibly high drain potential present at the chip edge.

The end regions 30e of the trenches 30 or trench structures 30 are lined with thick oxide in the form of a field oxide FOX on the entire vertical extent at their wall regions 30w, as is illustrated in cross section in FIG. 4 and in plan view in FIG. 3.

The cross-sectional views of FIG. 4 and 5 likewise illustrate the fillings with the material for the gates G and also the gate termination regions in the form of an insulation filled in the upper region in the form of a trench top oxide TTO.

FIG. 6 likewise shows a diagrammatic plan view of a structure for an edge region R, R' or corner region of a cell array Z of a trench structure transistor arrangement 10 of an embodiment of the semiconductor component 1 according to the invention, but corresponding source regions S, body regions B and body contact regions Bk are indicated here in addition to the dimensioning conditions with regard to the oxide layer FOX, GOX that insulate the wall regions 30w, trench structures 30 or trenches 30.

It can clearly be seen that the source regions S are formed in the mesa zones M or mesa regions M of the intermediate regions of adjacent trench structures 30. In this case, the source regions S are situated strictly in those regions of the mesa M defined by the wall regions that are lined exclusively by the thin gate oxide GOX in the upper trench section. In other words, the source regions S are situated, as considered laterally, strictly outside the region defined by the field oxide FOX or thick oxide FOX or strictly at the level of the gate oxide GOX. What are formed directly adjoining those are the so-called body contact regions Bk, which laterally overlap both the gate oxide GOX in the narrower sense and the field oxide FOX in the mesa M. The body regions B follow in a manner such that they directly adjoin the body contact regions Bk and are remote from the source regions S. Said body regions are formed in such a way that they are at a finite distance from the upper edge r of the upper edge region R or the end regions 30e of the trench structures 30. This also means that the end regions Be of the body regions B are laterally formed strictly at the level of the field oxide regions FOX, i.e. without any overlap with the gate oxide GOX in the narrower sense.

As an alternative, however, the positions of the body regions B and of the body contact regions Bk may also be laterally interchanged.

Moreover, the body regions B and the body contact regions Bk may be displaced laterally, that is to say parallel to the longitudinal direction of the trench structures 30, as long as the source regions S laterally remain strictly at the level of the gate oxide GOX in the narrower sense and as long as the body regions B strictly remain at the level of the field oxide FOX and genuinely spaced apart from the upper edge r of the cell array Z.

Moreover, the source regions S and the body contact regions Bk may be provided in alternate fashion as long as only the source ends Se or source end regions Se lie in the gate oxide region GOX and the body contact ends Bke or body contact end regions Bke lie in the field or thick oxide region FOX.

The source ends Se or source end regions Se, the body ends Be or body end regions Be and the body contact ends Bke or body contact end regions Bke are terms that in each case mean the end regions of the respective doping regions.

FIG. 7 shows, in addition to the arrangement of FIG. 6, that, in the case of the trench 30' that is marginal with regard to the lateral edge r', in contrast to the embodiment in FIG. 6, no source region S is provided in the corresponding mesa M', rather a continuous body contact region Bk is formed instead of this. This serves for eliminating a parasitic npn bipolar transistor that possibly occurs at the edge or the influence of said transistor.

FIG. 8 shows, in a diagrammatic plan view in addition to the illustration shown in FIG. 6, gate contact regions Gk arranged strictly in the end regions 30e of the respective trench structures 30 or trenches 30. In addition, provision is also made of a corresponding contact-connecting ring 40 for the external connection of the gate contacts Gk, which externally surrounds the cell array Z at a distance from the lateral edge r' of the cell array Z.

Even further on the outside, the illustration shows a source implantation region 50 in the form of a source implantation ring 50 which likewise externally surrounds the cell array Z at a distance from the first or upper edge r. The source implantation ring 50 may optionally make contact with the second or lateral edge r'.

The source implantation ring 50 has the function of suppressing a parasitic p-channel transistor or the influence thereof from the chip edge toward the inner cell array.

FIG. 9 shows a diagrammatic and sectional plan view of an embodiment—comparable to the embodiment of FIG. 8—of a semiconductor component according to the invention. In this case, however, although the gate contact regions Gk are still arranged in the end region 30e of the respective trench structures 30 and, consequently, strictly at the level of the field oxide FOX, the gate contact regions Gk are formed in a manner spaced apart from the upper edge r of the cell array Z. The illustration also again shows the gate connection ring 40 and also the source implantation ring 50.

Finally, FIG. 10 and 11 show an embodiment of the semiconductor component 1 according to the invention in a diagrammatic plan view and sectional side view, respectively, two gate regions G1 and G2 with corresponding gate contact-connections Gk1 and Gk2, respectively, and corresponding gate connection rings 40-1 and 40-2, respectively, being provided. Between the fillings for the first and second gates G1 and G2, respectively, an isolating oxide is in each case formed in the trench structures 30 and insulates the two gate electrodes G1 and G2 from one another.

FIG. 12A and 12B show various geometrical aspects of the semiconductor component 10 according to the invention in the form of a diagrammatic and sectional side view and in the form of a plan view, respectively.

In particular, the illustration shows the transition region Ü between the relatively thin gate oxide GOX and the relatively thick field oxide FOX or thick oxide FOX in the end region 30e of a trench 30.

In the semiconductor substrate 20, a body region is formed in p-doped fashion, a body contact region is formed in $p^+$-doped fashion, and a source region S is formed in $n^+$-doped fashion in the mesa M. The body region B reaches as far as a specific depth in the mesa M. The end region Be of the body region, that is to say in particular the corresponding dopant concentration boundary, lies laterally genuinely in the region defined by the field oxide, that is to say in particular not in the transition region Ü, and also in a manner genuinely spaced apart from the first and upper edge r. The source region is genuinely contained in the body region and has with the latter a common surface region of the surface 20a of the semiconductor substrate 20. The end region Se of the source region S and thus the boundary with the body contact region Bk lie laterally genuinely outside the region defined by the field oxide FOX, that is to say in this case laterally genuinely within the region defined by the relatively thin gate oxide region GOX, that is to say laterally strictly at the level of the gate oxide GOX. However, a position in the transition region Ü is also conceivable.

Figure 14:
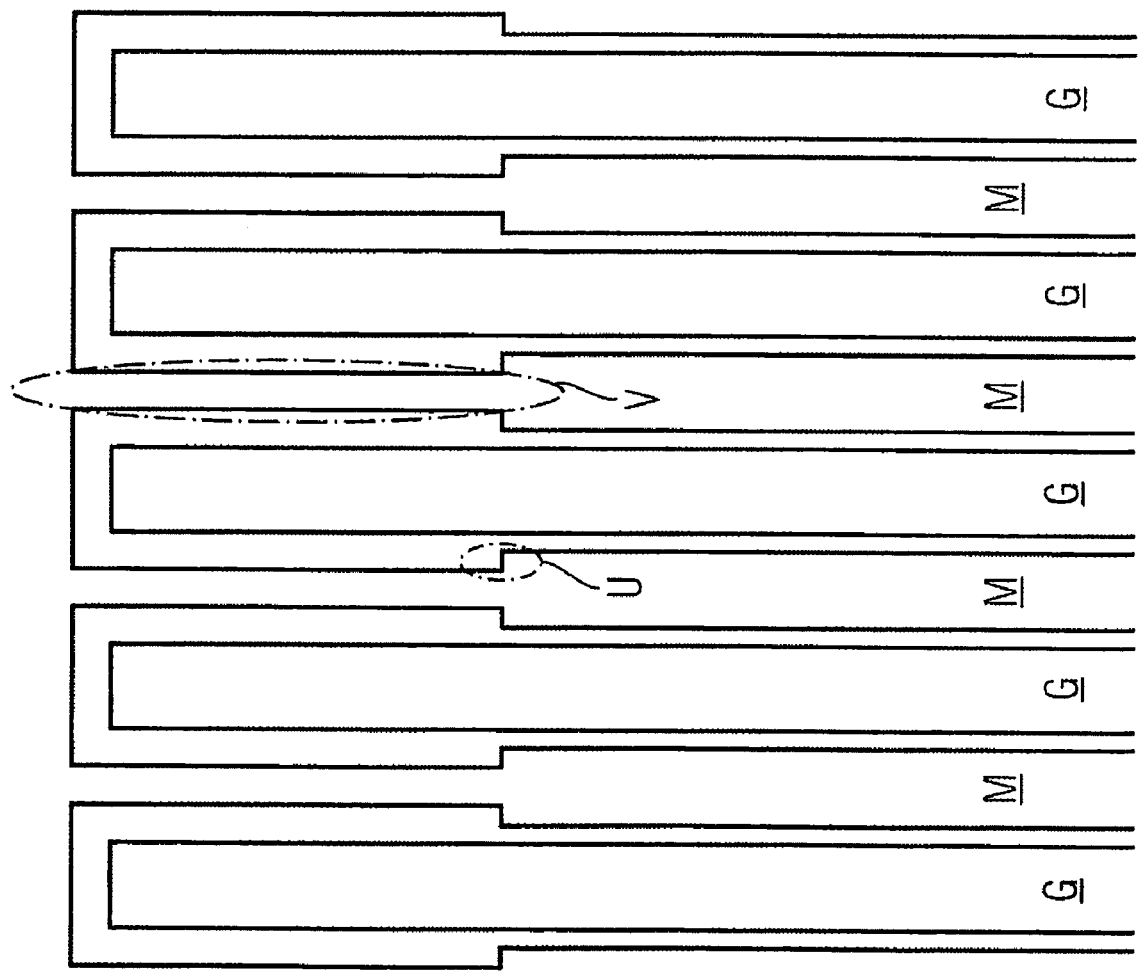

FIG. 13 and FIG. 14 show the site and region of increased electric field strengths as arise in conventional semiconductor components 100 on account of the conventional trench geometry and configuration.

In FIG. 13, corner regions X and Y are to be taken into account in the case of T pieces.

In the case of the conventional embodiment of FIG. 14, problems occur due to constrictions V of the mesa M and corners U brought about thereby.

LIST OF REFERENCE SYMBOLS

1 Semiconductor component according to the invention
10 Trench structure transistor arrangement
20 Semiconductor material region, semiconductor material substrate, chip
20a Surface region
30 Trench structure, trench
30e End region of the trench
30w Wall region of the trench
30' Laterally marginal trench
40 Gate connection region, gate connection ring
40-1, 40-2 Gate connection region, gate connection ring
50 Source implantation ring, source implantation region
B Body region, Body
Be End, ending, end region of the body region B
Bk Body contact region, body contact Bk' Body contact region, body contact
Bk" Body contact region, body contact
Bke End, ending, end region of the body contact region B
D Drain region, Drain
$D_{GOX}$ Layer thickness of gate oxide region
$D_{FOX}$ Layer thickness of field oxide region
$D_{MESA}$ Mesa width
$D_{TRENCH}$ Trench width, outer trench width
FOX Field oxide, field oxide region
G Gate region
Gk Gate contact region, gate contact
Gk1, Gk2 Gate region
G1, G2 Gate contact region, gate contact
GOX Gate oxide region in the narrower sense
M mesa region, mesa
r first or upper/lower edge of the cell array/semiconductor substrate
r' second or lateral edge of the cell array/semiconductor substrate
R first or upper edge region of the cell array/semiconductor substrate
R' second or lateral edge region of the cell array/semiconductor substrate
S source region, source
Se end, ending, end region of the source region s
T transistor device, field-effect transistor, trench structure transistor device, trench transistor
TTO trench top oxide
Ü lateral transition region between gate oxide GOX and field oxide FOX
U possible breakdown location
V possible breakdown location
X possible breakdown location
Y possible breakdown location
Z cell array

The invention claimed is:

1. A semiconductor component comprising:
a semiconductor material region comprised of a trench structure transistor arrangement including a transistor cell array, the transistor cell array including a plurality of trench transistors arranged in a strip-type fashion in a plurality of trench structures;
the trench transistors comprising gate regions formed in the interior of the trench structures and electrically insulated from wall regions of the respective trench structures by an insulating oxide layer;
the trench transistors further comprising source regions and body regions arranged in mesa regions located between adjacent trench structures in the semiconductor material region, the source regions being disposed within respective body regions and having a common surface region with the respective body regions; and
a first lateral edge region of the transistor cell array wherein the insulating oxide layer in lateral end regions of the respective trench structures has a first layer thickness in the form of a field oxide, and the insulating oxide layer outside the first lateral edge region has a second layer thickness in the form of a gate oxide, the first layer thickness greater than the second layer thickness.

2. The semiconductor component of claim 1 wherein, in the first lateral edge region of the transistor cell array, the source regions of the respective trench transistors are arranged laterally outside the region of the insulating oxide layer, with the source regions outside the region of the field oxide and laterally at the level of the gate oxide.

3. The semiconductor component of claim 1 wherein, in the first lateral edge region of the transistor cell array, the end regions of the respective body regions are formed laterally at the level of the field oxide and in a manner spaced apart from an upper edge of the cell array.

4. The semiconductor component of claim 1 wherein the trench transistors further comprise body contact regions arranged in the regions located between adjacent trench structures, each body contact region spaced apart from the first lateral edge region and each body contact region arranged with a contact and an overlap with the respective body region.

5. The semiconductor component of claim 1 wherein at least one of the body contact regions are arranged marginally with respect to the respective source region and toward the first lateral edge region.

6. The semiconductor component of claim 5 wherein the plurality of body contact regions comprise a comparatively laterally far extended body contact region that is marginal with respect to the source region and a further body contact region that replaces a region of the respective source region.

7. The semiconductor component of claim 1 wherein the body region of the respective trench transistor is arranged in a manner laterally spaced apart from the upper edge of the cell array within the respective region defined by the field oxide, and the body contact region of the respective trench transistor is arranged between the corresponding source region and the corresponding body region in a region which is defined by the transition between field oxide and gate oxide of the respective trench transistor.

8. The semiconductor component of claim 1 wherein the body contact region of the respective trench transistor is arranged from the upper edge of the cell array laterally within the region defined by the field oxide, and the body region of the trench transistor is arranged between the corresponding source region and the corresponding body contact region in a region which is defined by the transition between field oxide and gate oxide of the respective trench transistor.

9. The semiconductor component of claim 1 wherein semiconductor material is continuously provided in the form of a mesa in the semiconductor material region such that a silicon material reaches from a surface of the transistor cell array as far as the depth of the trench structure.

10. The semiconductor component of claim 1 wherein the transistor cell array is formed by a plurality of substantially identical and equidistantly spaced-apart trench structures in the form of a substantially homogeneous strip arrangement and a strip-type mesa is realized thereby.

11. The semiconductor component of claim 1 wherein at least one of the trench structures is arranged on a lateral edge region of the cell array, and the at least one trench structure has an edge side trench wall with a field oxide as the insulating oxide layer along the complete edge side trench wall.

12. The semiconductor component of claim 1 wherein the transistor cell array includes a lateral edge region comprising a edge-side trench and an edge-side mesa region, and the transistor cell array is formed without a source region on its edge-side mesa region.

13. The semiconductor component of claim 1 wherein the transistor cell array includes a lateral edge region comprising a edge-side trench and an edge-side mesa region, and the trench transistor in the lateral edge region includes a body contact region that completely covers the edge-side mesa region.

14. The semiconductor component of claim 13 wherein the directly adjacent to the trench structure arranged in the lateral edge region of the cell array, the mesa regions of further trench structures are contiguously formed with a body contact region that laterally completely covers the dimension of the mesa region.

15. The semiconductor component of claim 1 wherein the trench transistors are formed as field plate transistor devices.

16. The semiconductor component of claim 1 wherein the thickness of the field oxide is at least 2.5 times greater than the thickness of the gate oxide in each trench structure in the first lateral edge region.

17. The semiconductor component of claim 1 wherein the width of each mesa region between two adjacent trench structures is less than the width of each of the trench structures.

18. The semiconductor component of claim 1 wherein the width of each mesa region between two adjacent trench structures is less than 2.5 times the thickness of the gate oxide.

19. The semiconductor component of claim 1 wherein gate contact region is formed on one of the trench structures laterally in the region of the field oxide in at least one end region of the trench structure, the gate contact region serving as a contact connection for at least one gate region.

20. The semiconductor component of claim 19 wherein the gate contact region is arranged removed from the upper edge of the cell array such that the gate contact region is formed within the region of one of the trench structures which is defined by the field oxide.

21. The semiconductor component of claim 19 wherein a source implantation region is provided as a source implantation ring outside the cell array.

22. The semiconductor component of claim 1 wherein the component has a lateral dimension that extends parallel to or on a surface of the component, and where the first lateral edge region defines an edge region with respect to the lateral dimension.

23. A semiconductor component having a transistor cell array in a semiconductor material region of the semiconductor component, the transistor cell array patterned in open fashion and comprising:
  a. a plurality of trench structures, each of the plurality of trench structures comprising an interior defined by wall regions of the trench structure, and each of the plurality of trench structures comprising a lateral end region;
  b. a plurality of mesa regions between the trench structures;
  c. a plurality of trench transistors arranged in the plurality of trench structures, the plurality of trench transistors comprising
     (i) body regions arranged in the mesa regions between adjacent trench structures;
     (ii) source regions arranged in the mesa regions between adjacent trench structures, each source regions contained in one of the body regions and each source region and body region having a common surface region; and
     (iii) gate regions arranged on the interior of the trench structures, the gate regions electrically insulated from the wall regions of the respective trench structures by an insulating oxide layer; wherein the insulating oxide in the lateral end regions of the respective trench structures has a first layer thickness and the insulating oxide outside of the lateral end regions has a second layer thickness, the first layer thickness greater than the second layer thickness, the insulating oxide in the lateral end regions comprising a field oxide, and the insulating oxide outside of the lateral end regions comprising a gate oxide.

* * * * *